United States Patent
Shibuya et al.

(10) Patent No.: US 8,570,695 B2
(45) Date of Patent: Oct. 29, 2013

(54) BATTERY SYSTEM

(75) Inventors: Nobuo Shibuya, Kanagawa (JP);
Kazuhide Ashida, Nagano (JP); Ryuichi Morikawa, Tokyo (JP); Shinichiro Kosugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 490 days.

(21) Appl. No.: 12/921,204

(22) PCT Filed: Mar. 5, 2009

(86) PCT No.: PCT/JP2009/001005
§ 371 (c)(1),
(2), (4) Date: Jan. 12, 2011

(87) PCT Pub. No.: WO2009/110244
PCT Pub. Date: Sep. 11, 2009

(65) Prior Publication Data
US 2011/0149454 A1 Jun. 23, 2011

(30) Foreign Application Priority Data
Mar. 7, 2008 (JP) .................. 2008-058627

(51) Int. Cl.
H02H 3/00 (2006.01)
(52) U.S. Cl.
USPC .......................................................... 361/78
(58) Field of Classification Search
USPC .......................................................... 361/78
See application file for complete search history.

(56) References Cited

U.S. PATENT DOCUMENTS

| | | | | |
|---|---|---|---|---|
| 6,608,470 B1 * | 8/2003 | Oglesbee et al. | ............. | 320/136 |
| 6,661,198 B2 | 12/2003 | Furukawa | | |
| 6,762,588 B2 | 7/2004 | Miyazaki et al. | | |
| 6,917,181 B2 * | 7/2005 | Emori et al. | .................. | 320/104 |
| 7,459,883 B2 * | 12/2008 | Miyamoto | .................... | 320/116 |
| 7,459,885 B2 * | 12/2008 | Miyamoto | .................... | 320/134 |
| 7,557,637 B2 * | 7/2009 | Sakamoto | .................... | 327/519 |
| 2002/0196000 A1 * | 12/2002 | Furukawa | .................... | 320/135 |
| 2005/0083722 A1 * | 4/2005 | Emori et al. | .................. | 365/149 |
| 2007/0114973 A1 | 5/2007 | Miyamoto | | |
| 2008/0284375 A1 * | 11/2008 | Nagaoka et al. | ............. | 320/116 |

(Continued)

FOREIGN PATENT DOCUMENTS

| | | |
|---|---|---|
| JP | 6 57039 | 8/1994 |
| JP | 11 160367 | 6/1999 |

(Continued)

*Primary Examiner* — Ronald W Leja
(74) *Attorney, Agent, or Firm* — Oblon, Spivak, McClelland, Maier & Neustadt, L.L.P.

(57) ABSTRACT

Provided is a battery system capable of preventing the voltage that is applied to the voltage detection circuit from exceeding the withstand voltage of the voltage detection circuit when the connection between the cells in the battery module is disconnected, and preventing an overcurrent from flowing in the cell voltage detection circuit and the module. The modules are internally provided with a battery voltage measurement circuit 2 for measuring the voltage of each cell. A reverse voltage protective diode 3 is disposed in the power supply route of the battery voltage measurement circuit 2, and adapted such that the anode thereof is connected to the negative electrode of a drive power source of the voltage measurement circuit and the cathode thereof is connected to the positive electrode of the drive power source of the voltage measurement circuit. A fuse 4 as an overcurrent protective element is provided to the power supply route of the battery voltage measurement circuit 2.

11 Claims, 11 Drawing Sheets

(56) References Cited

U.S. PATENT DOCUMENTS

| | | |
|---|---|---|
| 2009/0169987 A1 | 7/2009 | Miyazaki et al. |
| 2009/0198399 A1* | 8/2009 | Kubo et al. ............ 701/22 |
| 2010/0209748 A1* | 8/2010 | Kudo et al. ............ 429/91 |
| 2010/0231177 A1 | 9/2010 | Ashida |
| 2011/0149454 A1* | 6/2011 | Shibuya et al. .......... 361/87 |

FOREIGN PATENT DOCUMENTS

| | | |
|---|---|---|
| JP | 2000 188826 | 7/2000 |
| JP | 2001 025149 | 1/2001 |
| JP | 2003 9411 | 1/2003 |
| JP | 2003 070179 | 3/2003 |
| JP | 2005 117780 | 4/2005 |
| JP | 2007 139664 | 6/2007 |

* cited by examiner

BATTERY SYSTEM

TECHNICAL FIELD

The present invention relates to a battery system configured by connecting one or more battery modules in series, and in particular relates to a battery system using a lithium ion battery in which each battery module is configured from one of more single cells and performing a protective operation in a case where a connection within such system is disconnected.

BACKGROUND ART

With electric vehicles, fuel cell vehicles and hybrid vehicles, an electric motor as a motor is used as the power source or the auxiliary power source. As the power source of this electric motor, a secondary battery in which numerous single cells having a storage battery are connected in series is adopted. In particular, if numerous lithium ion batteries in which the battery voltage of the single cells is high are connected in series, it is possible to achieve high voltage and high output. Thus, in recent years, the development of a battery system adopting a battery pack in which signal cells configured from a lithium ion battery are connected in series is becoming popular.

As conventional technology, for example, a device for detecting the voltage of a battery pack for an electric vehicle having a main battery configured from numerous battery modules for storing running power at a high voltage of 300 V, and an auxiliary battery to be used for auxiliary drive has been proposed. This voltage detection device has a voltage detection circuit for individually detecting the voltage from the respective battery modules, and a signal processing circuit for processing signals that indicate the respective module voltages detected with the voltage detection circuit, and the voltage detection circuit uses the power supplied from the auxiliary battery via a DC-DC converter as the drive power (refer to Patent Document 1). Thus, it is possible to realize high accuracy upon detecting the open-circuit module voltage, and avoid the unwanted decrease in the life of the high voltage battery pack.

As another conventional technology, proposed is a power storage device configured by connecting single batteries of a plurality of secondary batteries in series to form a power storage module and arranging a plurality of such power storage modules for use in an electric vehicle, wherein the respective power storage modules comprise a controller for controlling the single batteries provided to the respective power storage modules (refer to Patent Document 2).

The controller of the power storage device seeks the logical sum of the detected voltage of the single batteries in the power storage module and the voltage from the high voltage potential-side controller, and outputs the result to the low voltage potential-side controller. The respective controllers comprise a voltage detection circuit for detecting the voltage of the signal battery in the power storage module to be controlled, and a superordinate controller for controlling the foregoing controller based on the voltage detected with the voltage detection circuit is also provided.

In addition, a battery protection IC for monitoring the module configured by connecting a plurality of single batteries in series is also being proposed (refer to Patent Document 3), and this is provided with an overvoltage detection circuit for determining an overcharge condition and outputting an overvoltage signal if a terminal voltage of any of the batteries in the module becomes a predetermined value or higher when the battery is being charged, and an over discharge detection circuit for determining an over discharge condition and outputting an over discharge signal if a terminal voltage of any of the batteries in the module becomes a predetermined value or lower when the battery is being discharged. Moreover, this battery protection IC also has a first switch capable of issuing a warning by being turned on when an overvoltage signal has been detected, and a second switch capable of issuing a warning by being turned on when an over discharge signal has been detected.

Patent Document 1: Japanese Published unexamined Application No. H11-160367
Patent Document 2: Japanese unexamined Patent Application No. 2003-70179
Patent Document 3: Japanese unexamined Patent Application No. 2005-117780

Meanwhile, as a result of using the foregoing conventional technologies, a battery system configured from a battery pack in which numerous lithium ion batteries are connected in series is provided with a voltage detection circuit for monitoring the voltage of the respective single cells, and this voltage detection circuit controls the generation of an overcharge or over discharge by monitoring the battery voltage.

Here, with a battery system configured from numerous lithium ion batteries, numerous wirings are required for connecting the single cells in the module and for connecting the modules. In addition, wiring for a large current up to the output terminal of the battery system is also required, and wiring from the single cells to the voltage detection circuit is also required.

Thus, when mounting a battery system with numerous components built therein and connected with wirings on a mobile object such as an automobile, since the battery system will be used for a long period of time in traveling conditions with continued vibration, there is a possibility that the components may become misaligned or a short circuit may occur due to the disconnection of wirings or the friction of components. Consequently, an abnormal voltage or current may occur in a circuit inside the voltage detection device configuring the battery system, and as a result, the circuit components and the like may ignite or generate smoke, and considerably hinder the driving operation of the automobile.

In particular, if the connection between the cells in the module having a voltage detection circuit for detecting the voltage of each cell is disconnected, an abnormal voltage exceeding the withstand voltage of the voltage detection circuit may be applied to the voltage detection circuit, to cause a disconnection in the detection circuit or the occurrence of a short circuit, and as a result, the circuit components or the printed pattern in the circuit substrate may generate heat and smoke and, in certain cases, may even ignite.

For example, as shown in FIG. 10(a), in a battery system configured by arranging a plurality of modules in which 10 cells are connected in series and having a battery voltage measurement circuit for measuring the voltage of the respective cells in the respective modules, if the cells in the module are disconnected during a discharge, the circuit voltage that is applied to the battery voltage measurement circuit can be expressed with the following expression.

$$\text{Voltage of measurement circuit} = (\text{Module voltage}) - (\text{Pack voltage}) \quad [\text{Expression 1}]$$

Provided that:
Pack voltage: voltage of all modules in battery system

Here, when taking an example of a battery pack using a lithium battery in which the voltage of each cell is 3.6 V and the pack voltage is generated by 10 modules, since 10 cells are connected in series in each module, the voltage of each module will be 36 V, and since a total of 100 cells of the 10 modules are connected in series, the pack voltage will be 360 V. Thus, as shown in FIG. 10(b), a voltage of −324 V is applied to the battery voltage measurement circuit. Consequently, the discrete element or IC configuring the measurement circuit will be destroyed to cause a short circuit current to flow, as a result, the circuit components, IC, circuit pattern and the like may generate heat, generate smoke or ignite.

Meanwhile, as shown in FIG. 11(a), if the cells in the module are disconnected while charging the battery pack via a charger, the circuit voltage that is applied to the battery voltage measurement circuit can be expressed with the following expression.

Voltage of measurement circuit=(Maximum voltage of discharger)−{(Pack voltage)−(Module voltage)}  [Expression 2]

Figure 10:
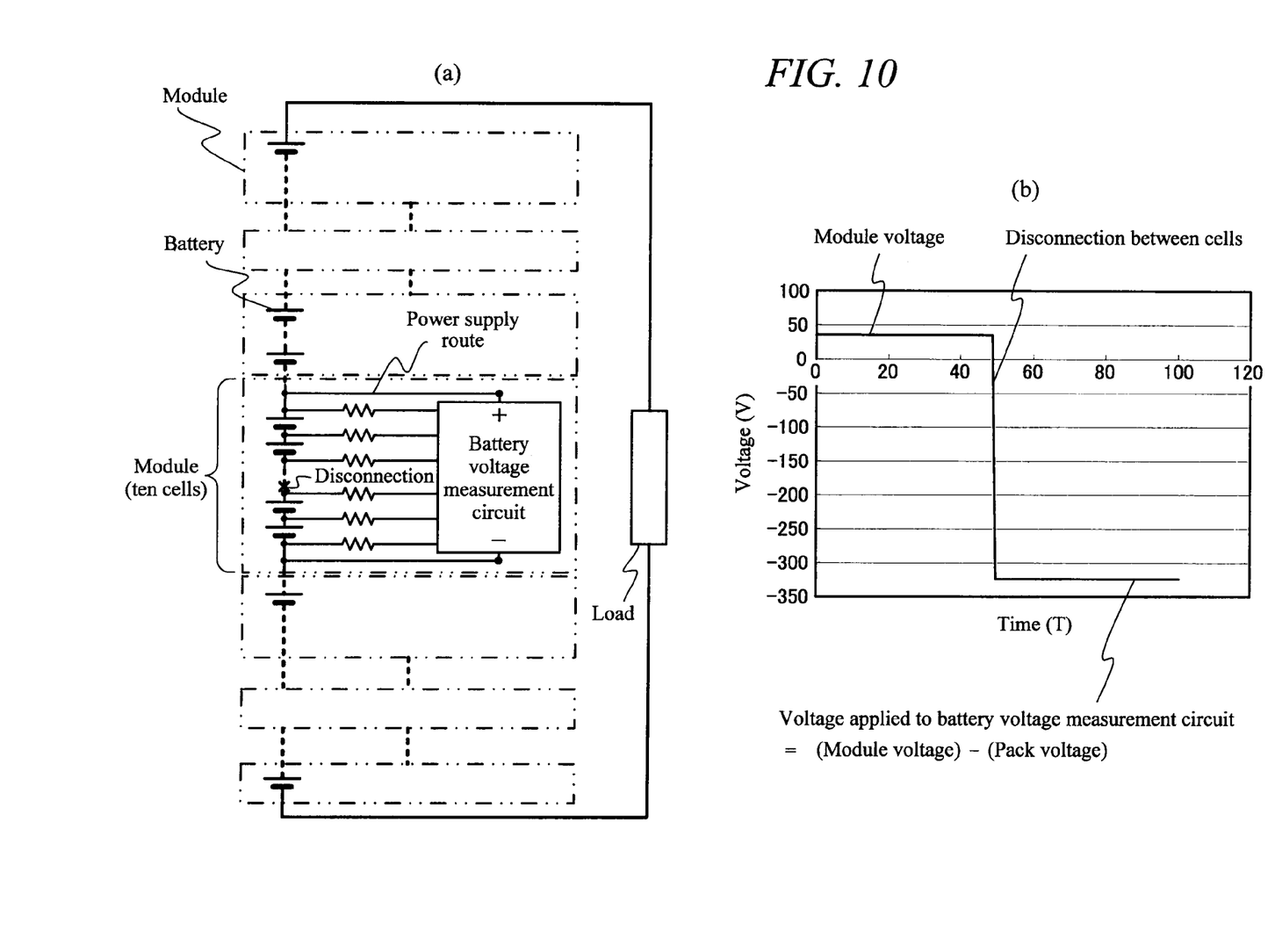
FIG. 10(a) is a configuration block diagram showing an example of a battery system according to conventional technology.
FIG. 10(b) is a diagram showing the passage of the voltage and current vales of the measurement circuit according to conventional technology when inter-cell disconnection occurs during a discharge.

Here, as with FIG. 10, when taking an example of a battery pack using a lithium battery in which the voltage of each cell is 3.6 V and the pack voltage is generated by 10 modules, and the maximum voltage during the load open-circuit of the charger is 550 V, since a total of 100 cells of the 10 modules are connected in series, the pack voltage will be 360 V, and the voltage of each module configured from 10 cells will be 36 V. Thus, as shown in FIG. 11(b), a voltage of 226 V will be applied to the battery voltage measurement circuit. Consequently, as with the case during a discharge, the discrete element or IC configuring the measurement circuit will be destroyed to cause a short circuit current to flow, as a result, the circuit components, IC, circuit pattern and the like may generate heat, generate smoke or ignite.

The present invention was devised in order to overcome the foregoing problems. Thus, an object of this invention is to provide a battery system capable of preventing the voltage that is applied to the voltage detection circuit from exceeding the withstand voltage of the voltage detection circuit when the connection between the cells in the battery module is disconnected, and preventing an overcurrent from flowing in the cell voltage detection circuit and the module.

DISCLOSURE OF THE INVENTION

In order to achieve the foregoing object, in one aspect of the invention, there is provided a battery system in which one or more modules are connected in series, wherein each of the modules comprises: a plurality of batteries connected in series; a voltage measurement circuit for measuring a voltage of each of the batteries; an overcurrent protection unit connected to the voltage measurement circuit; and a reverse voltage protective diode in which the cathode thereof is connected to the positive electrode of a drive power source of the voltage measurement circuit and the anode thereof is connected to the negative electrode of the drive power source of the voltage measurement circuit.

In the foregoing aspect, even if the connection between the cells in the module is disconnected during a discharge, due to the reverse voltage protective diode connected to the voltage measurement circuit, only voltage in the forward direction of the diode will be applied, and it is possible to prevent a voltage exceeding the withstand voltage of the voltage measurement circuit from being applied. In addition, since the overcurrent protection unit, for example, fuse is provided, although the current value will fluctuate at the moment of fusing, the fuse will be instantaneously subjected to fusing, as a result, it is possible to prevent the overcurrent from flowing in the voltage measurement circuit or in the pattern of the printed circuit board having a circuit mounted thereon. Consequently, it is possible to inhibit the circuit components, printed pattern and the like from generating heat, generating smoke, and igniting. Note that in the overcurrent protection unit, in addition to a fuse, a PolySwitch or the like may be used as the self-recovering type overcurrent protective element, and an overcurrent blocking diode may be also used.

In another aspect of the invention, there is provided a battery system in which one or more modules are connected in series, wherein each of the modules comprises: a plurality of batteries connected in series; a voltage measurement circuit for measuring a voltage of each of the batteries; an overcurrent protection unit connected to the voltage measurement circuit; and an overvoltage protective zener diode in which the cathode thereof is connected to the positive electrode of a drive power source of the voltage measurement circuit and the anode thereof is connected to the negative electrode of the drive power source of the voltage measurement circuit.

In the foregoing aspect, even if the connection between the cells in the module is disconnected during a charge, due to the overvoltage protective zener diode connected to the voltage measurement circuit, only a zener voltage will be applied to the voltage measurement circuit, and it is possible to inhibit a load exceeding the withstand voltage of the voltage measurement circuit from being applied. In addition, since the overcurrent protection unit, for example, a fuse is provided, the fuse will be instantaneously subjected to fusing, as a result, no voltage will be applied to the voltage measurement circuit and it is possible to prevent an overcurrent from flowing in the voltage measurement circuit or in the pattern of the printed circuit board having a circuit mounted thereon. Consequently, it is possible to inhibit the circuit components, printed pattern and the like from generating heat, generating smoke, and igniting.

In another aspect of the invention, there is provided a battery system in which one or more modules are connected in series, wherein each of the modules comprises: a plurality of batteries connected in series; a voltage measurement circuit for measuring a voltage of each of the batteries; an overcurrent protective element connected to the voltage measurement circuit; a diode connected in series to the overcurrent protective element, the forward direction thereof being a direction in which an overcurrent is blocked; a resistor connected in parallel to the diode; and an overvoltage protective zener diode in which the cathode thereof is connected to the positive electrode of a drive power source of the voltage measurement circuit and the anode thereof is connected to the negative electrode of the drive power source of the voltage measurement circuit.

In the foregoing aspect, even if the connection between the cells in the module is disconnected during a discharge, due to the overvoltage protective zener diode connected to the voltage measurement circuit, only a voltage in the forward direction of the zener diode will be applied, and if it is during a charge, only a zener voltage will be applied to the voltage measurement circuit due to the overvoltage protective zener diode. Thus, it is possible to inhibit the voltage that is applied to the voltage measurement circuit to be lower than the withstand voltage of the voltage measurement circuit. In addition, since the overcurrent protective element, for example, a fuse is provided, the fuse will be instantaneously subjected to fusing, as a result, no voltage will be applied to the voltage measurement circuit and it is possible to prevent an overcurrent from flowing in the voltage measurement circuit or in the pattern of the printed circuit board having a circuit mounted thereon. Consequently, it is possible to inhibit the circuit components, printed pattern and the like from generating heat, generating smoke, and igniting.

Moreover, as a result of providing a diode that prevents the current from flowing in the reverse direction and a providing resistor in parallel to the diode, in addition to preventing the overcurrent from flowing to the voltage measurement circuit, it is also possible to flow a slight amount of discharge current to the other modules via the resistor even during a discharge. Thus, even in cases where the voltage measurement circuit is configured from a single IC, the drive of the overall battery system will not be interrupted.

As a result of using the foregoing invention, it is possible to provide a battery system capable of preventing a voltage exceeding the withstand voltage from being applied to the battery voltage measurement circuit due to the reverse voltage protective diode even if the connection between cells is disconnected in the respective battery modules during a discharge, and further capable of inhibiting an overcurrent flow in the voltage measurement circuit or in the pattern of the printed circuit board having a circuit mounted thereon due to the diode or the overcurrent protective fuse. In addition, even in cases where the connection between the cells is disconnected during a regeneration or during a charge, a voltage that is greater than the withstand voltage will not be applied to the battery voltage measurement circuit due to the overvoltage protective diode, and an overcurrent flow in the measurement circuit or in the pattern of the printed circuit board having a circuit mounted thereon is prevented due to the overcurrent protective fuse. Consequently, the discrete element or IC configuring the measurement circuit will not be destroyed, and it is possible to inhibit the circuit components, IC, circuit pattern and the like from generating heat, generating smoke and igniting that would occur if there were a flow of short circuit current.

DESCRIPTION OF REFERENCE NUMERALS

1 . . . battery
2 . . . battery voltage measurement circuit
3 . . . reverse voltage protective diode
4 . . . fuse
5 . . . resistor
6 . . . diode
7 . . . resistor
8 . . . charger
9 . . . overvoltage protective zener diode

BEST MODE FOR CARRYING OUT THE INVENTION EMBODIMENTS

1. First Embodiment

Discharge

A battery system according to a first embodiment is now explained with reference to FIG. 1 to FIG. 6. Note that the number of batteries, the number of modules and the cell voltage shown below are arbitrary, and are not limited to the modes shown in FIG. 1 to FIG. 6.

1.1. Example (1)

Figure 1:
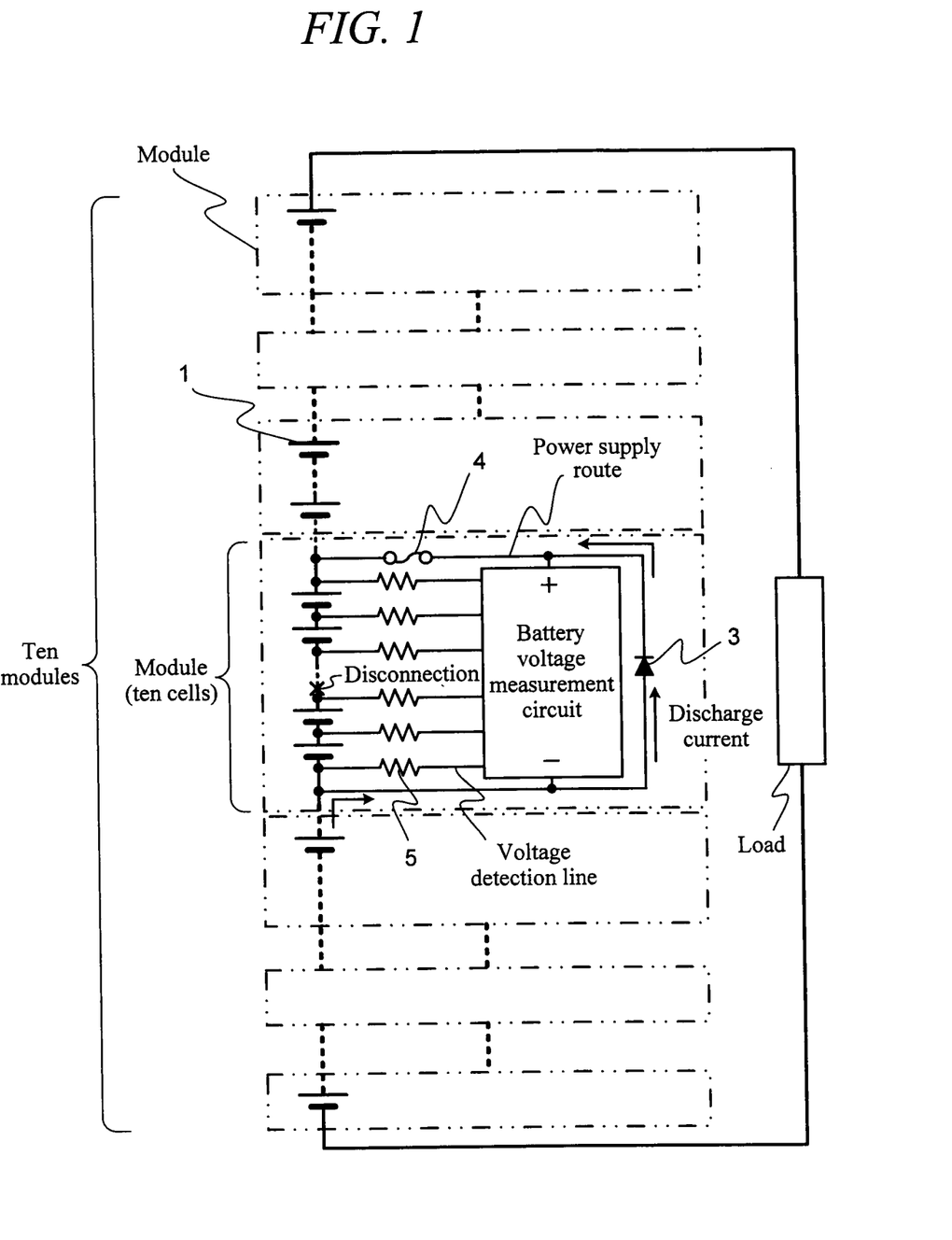
FIG. 1 is a configuration block diagram showing the battery system according to the first embodiment of the present invention (Example (1))
Figure 2:
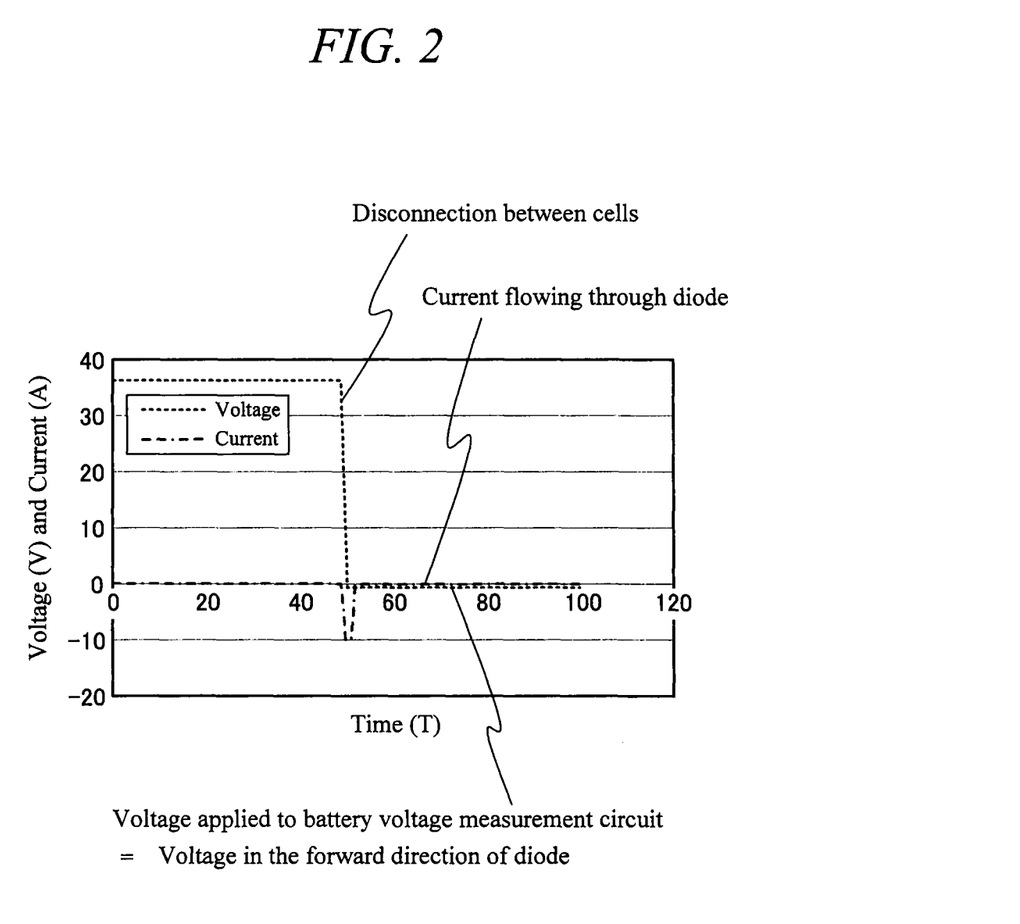
FIG. 2 is a diagram according to the first embodiment of the present invention showing the passage of the voltage and current values of the measurement circuit when inter-cell disconnection occurs during a discharge (Example (1))

Foremost, Example (1) of the battery system according to the first embodiment is explained below with reference to FIG. 1 and FIG. 2. FIG. 1 is a configuration block diagram of Example (1) according to the first embodiment, and FIG. 2 is a graph showing the passage of the voltage and current values applied to the battery voltage measurement circuit in the battery system configured as shown in FIG. 1 when the connection between the cells in the module is disconnected.

As shown with the conventional technology, with the configuration block diagram of FIG. 1, modules are disposed, which are configured from 10 cells respectively having batteries 1 and being connected in series, and 10 of these modules are connected in series. Here, as with the conventional technology explained above with reference to FIG. 10, an example of a battery pack using a lithium battery in which the voltage of each cell is 3.6 V, is explained.

The modules are internally provided with a battery voltage measurement circuit 2 for measuring the voltage of each cell included in the modules, and the batteries 1 of each cell are connected to the battery voltage measurement circuit 2 through a cell voltage detection line. The battery voltage measurement circuit 2 includes a circuit configured from a discrete element and an IC circuit.

With regard to the battery voltage measurement circuit 2, a reverse voltage protective diode 3 is disposed in the power supply route of the battery voltage measurement circuit 2. The reverse voltage protective diode 3 is adapted such that the anode thereof is connected to a cell of the low voltage potential side in the module and the cathode thereof is connected to a cell of the high voltage potential side in the module. This reverse voltage protective diode 3 is also adapted such that the anode thereof is connected to the negative electrode of a drive power source of the voltage measurement circuit and the cathode thereof is connected to the positive electrode of the drive power source of the voltage measurement circuit.

A fuse 4 as an overcurrent protective element is also provided to the power supply route of the battery voltage measurement circuit 2. As the fusing characteristics of the fuse 4, the rated current value is set to be smaller than the tolerated current value of the reverse voltage protective diode 3 and the tolerated current value of the printed pattern having a circuit mounted thereon, and to a value where fusing will not occur with the consumption current of the battery voltage measurement circuit 2. Specifically, a fuse 4 that satisfies the foregoing conditions of a rated current value is selected.

In addition, a resistor 5 for preventing a short circuit of the voltage detection line is respectively disposed on the voltage detection line connecting the batteries 1 of each cell in the module and the battery voltage measurement circuit 2, and an input protective diode not shown is provided inside the IC of the battery voltage measurement circuit 2.

With a battery system configured as described above, if the connection between the cells in the module is disconnected during a discharge, as shown in FIG. 2, only a voltage (approximately −0.7 V) in the forward direction of the reverse voltage protective diode 3 is applied to the measurement circuit 2 due to the reverse voltage protective diode 3 connected to the battery voltage measurement circuit 2, and a voltage exceeding the withstand voltage of the measurement circuit 2 will not be applied.

In addition, although the current value will fluctuate at the moment of fusing, since the fuse 4 will be instantaneously subjected to fusing as the overcurrent protective element due to the discharge current flowing as shown in FIG. 1, it is possible to prevent a overcurrent from flowing in the battery voltage measurement circuit 2 or in the pattern of the printed circuit board having a circuit mounted thereon (current value: 0 A). Consequently, it is possible to prevent the circuit components, printed pattern and the like from generating heat, generating smoke, and igniting.

Moreover, due to the short circuit preventive resistor 5 disposed between the respective cell voltage input circuits (not shown) and the batteries 1 in the battery voltage measurement circuit 2 and the input protective diode (not shown) in the measurement circuit 2, an input to the measurement circuit 2 will not exceed the power supply voltage of the measurement circuit 2. Thus, it is possible to prevent a latch-up. Consequently, since it is possible to inhibit the circuit components, printed pattern and the like from generating heat, generating smoke and igniting, it is possible to reuse the battery voltage measurement circuit 2, which has not been destroyed, by repairing the disconnection between the cells.

1.2. Example (2)

Figure 3:
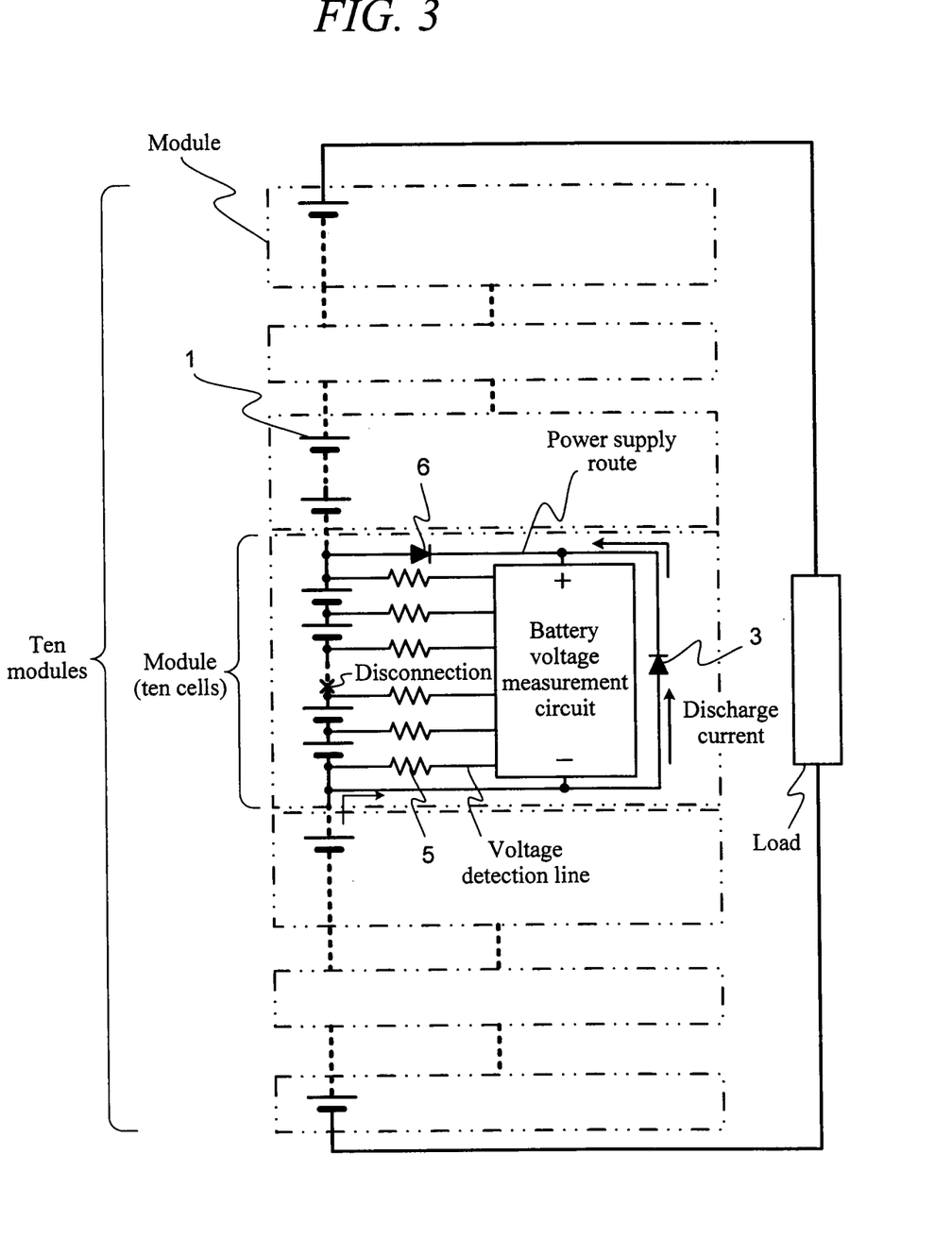
FIG. 3 is a configuration block diagram showing the battery system according to the first embodiment of the present invention (Example (2))

Example (2) of the battery system according to the first embodiment is now explained with reference to FIG. 3 and FIG. 4. FIG. 3 is a configuration block diagram of Example (2) according to the first embodiment, and FIG. 4 is a graph showing the passage of the voltage and current values applied to the battery voltage measurement circuit in the battery system configured as shown in FIG. 3 when the connection between the cells in the module is disconnected.

In the configuration block diagram of FIG. 3, a diode 6 in which its forward direction is a direction of supplying power to the battery voltage measurement circuit 2 is disposed in substitute for the fuse 4 as the overcurrent protective element that is provided to the power supply route of the battery voltage measurement circuit 2 of FIG. 1. As shown in FIG. 3, the diode 6 is disposed such that the direction of blocking an overcurrent (discharge current) arising in cases where the connection between the cells is disconnected is the forward direction of the diode 6.

Figure 4:
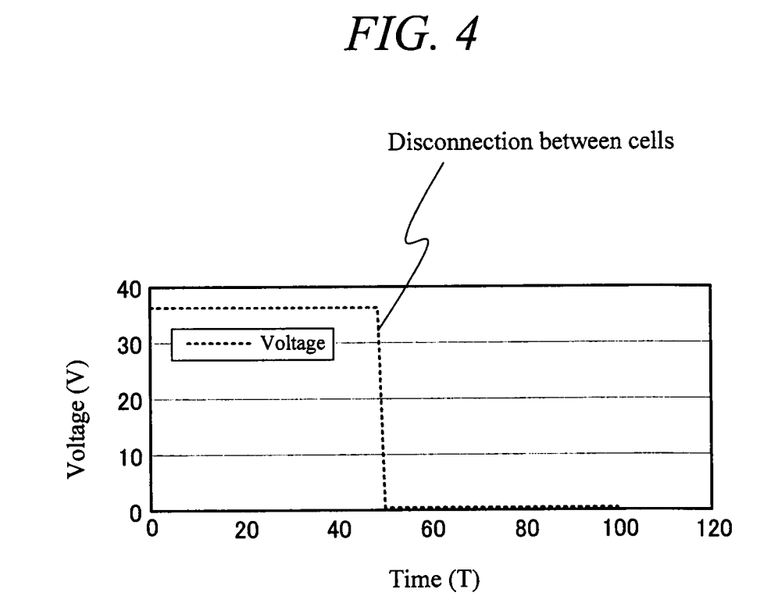
FIG. 4 is a diagram according to the first embodiment of the present invention showing the passage of the voltage value of the measurement circuit when inter-cell disconnection occurs during a discharge (Example (2))

As a result of using the battery system configured as described above, if the connection between the cells in the module is disconnected during a discharge, as shown in FIG. 4, only a voltage (approximately −0.7 V) in the forward direction of the reverse voltage protective diode 3 is applied by the reverse voltage protective diode 3 connected to the battery voltage measurement circuit 2 as with Example (1), and a voltage exceeding the withstand voltage of the measurement circuit 2 will not be applied to the measurement circuit 2.

In addition, due to the diode 6, which is disposed in substitute for the fuse, in which its forward direction is a direction of blocking an overcurrent such as discharge current arising when a disconnection occurs, since a current will not flow in the reverse direction; that is, in the direction that the overcurrent flows, it is possible to prevent the circuit components, printed pattern and the like from generating heat, generating smoke, and igniting. Moreover, as shown in FIG. 1 and FIG. 2, unlike the case of using the fuse 4 as the overcurrent protective element, an overcurrent will not flow to the battery voltage measurement circuit 2 even at the instant that the connection between the cells is disconnected. Thus, since the battery voltage measurement circuit 2 is generally of a low consumption current, it is possible to draw a fine printed pattern for allowing the measurement circuit 2 to be mounted thereon, and realize compact, high-density mounting.

Since the IC of the battery voltage measurement circuit 2 will not be destroyed even if the connection between the cells in the module is disconnected, the battery voltage measurement circuit 2 can be reused by repairing the disconnection between the cells.

1.3. Example (3)

Figure 5:
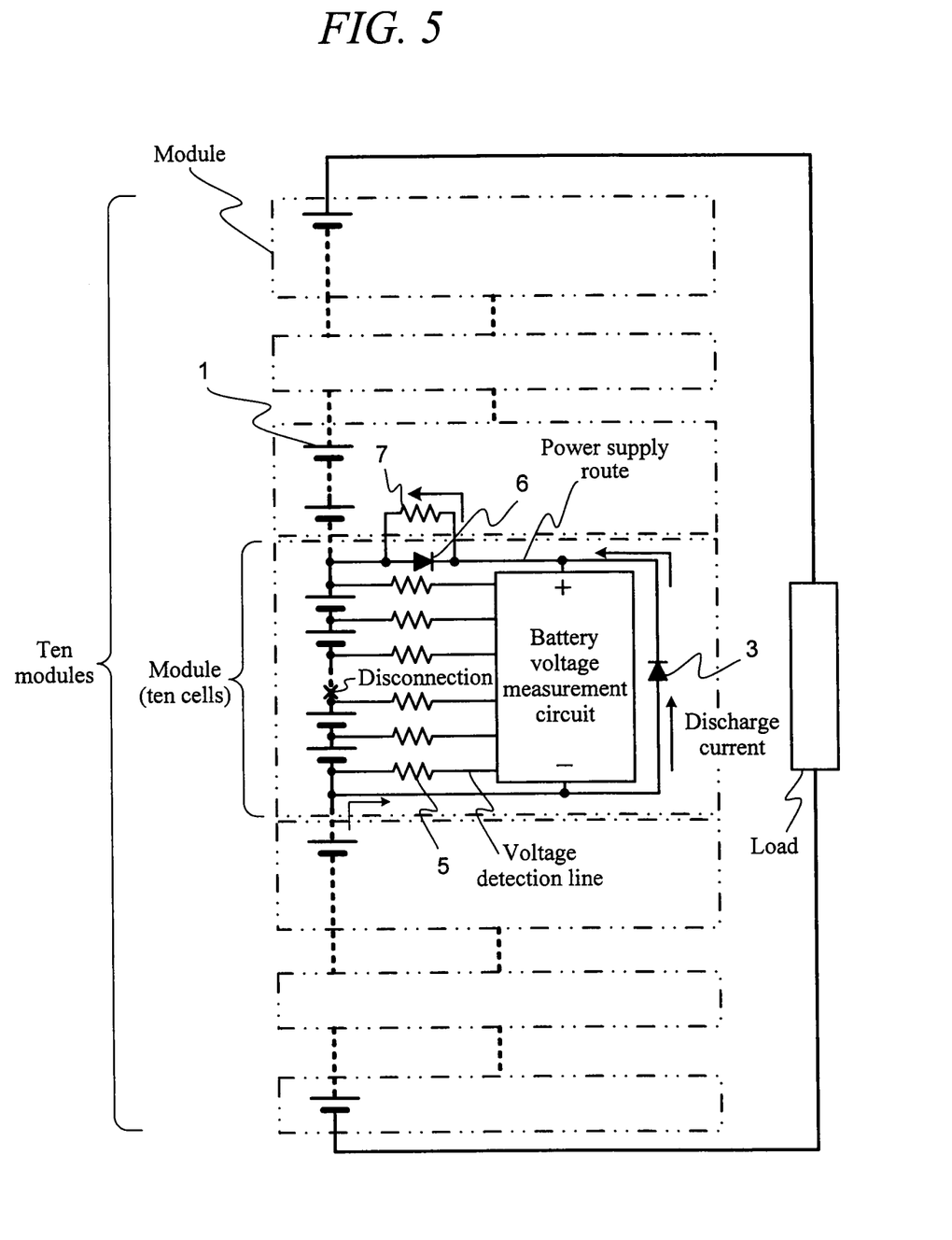
FIG. 5 is a configuration block diagram showing the battery system according to the first embodiment of the present invention (Example (3))

Example (3) of the battery system according to the first embodiment is now explained with reference to FIG. 5 and FIG. 6. FIG. 5 is a configuration block diagram of Example (3) according to the first embodiment, and FIG. 6 is a graph showing the passage of the voltage and current values applied to the battery voltage measurement circuit in the battery system configured as shown in FIG. 5 when the connection between the cells in the module is disconnected.

In the configuration block diagram of FIG. 5, a resistor 7 is disposed in parallel to the diode 6 provided to the power supply route of the battery voltage measurement circuit 2 of FIG. 3. Except for this, the configuration is the same as the configuration block diagram shown in FIG. 3. As the resistor 7 that is connected in parallel to the diode 6, selected is a type that is able to realize a voltage drop that is smaller than the voltage in the forward direction of the diode 6 when a current that is required for the operation of the battery voltage measurement circuit 2 is flowing.

Figure 6:
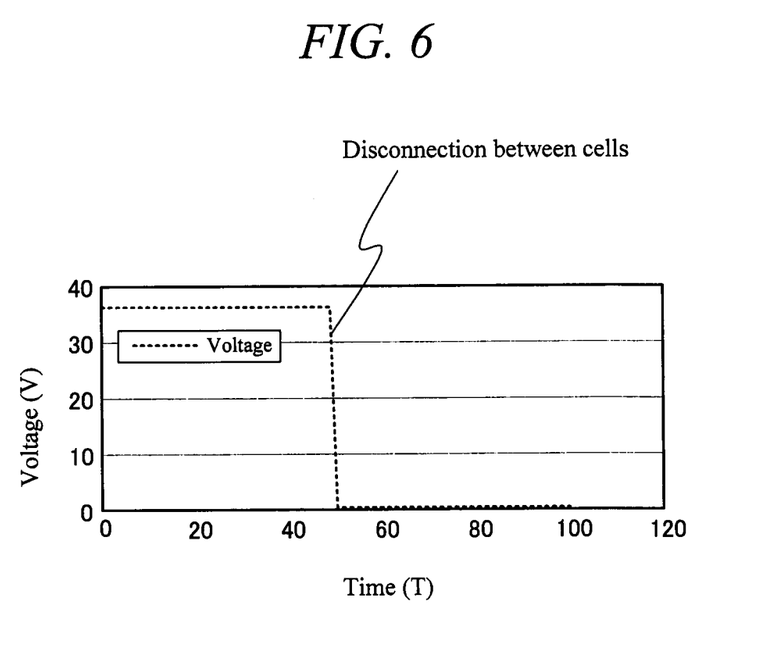
FIG. 6 is a diagram according to the first embodiment of the present invention showing the passage of the voltage value of the measurement circuit when inter-cell disconnection occurs during a discharge (Example (3))

As a result of using the battery system configured as described above, if the connection between the cells in the module is disconnected during a discharge, as shown in FIG. 6, only a voltage (approximately −0.7 V) in the forward direction of the diode 3 is applied due to the reverse voltage protective diode 3 connected to the battery voltage measurement circuit 2 as with Examples (1) and (2), and a voltage exceeding the withstand voltage of the measurement circuit 2 will not be applied.

Figure 7:
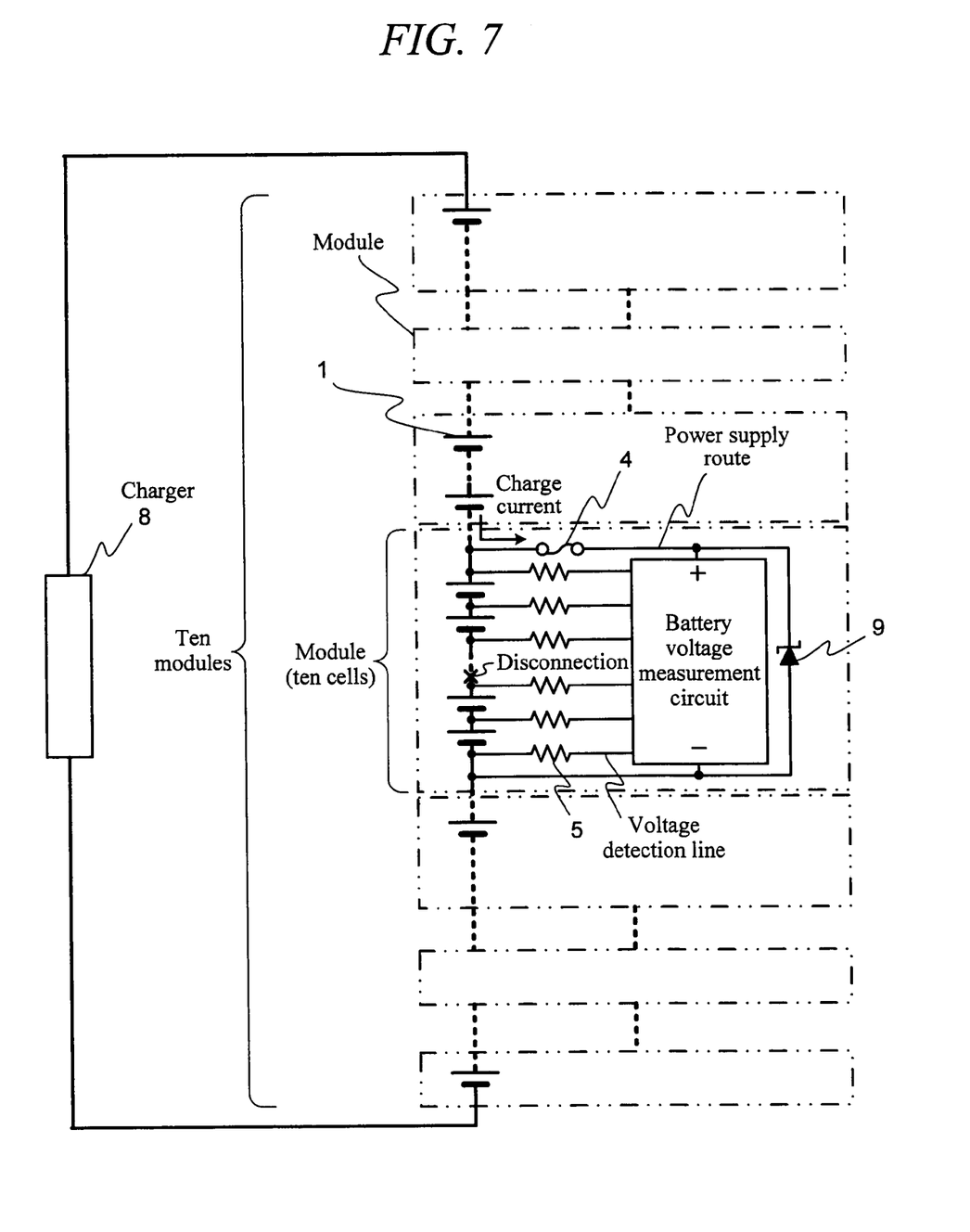
FIG. 7 is a configuration block diagram showing the battery system according to the second embodiment of the present invention.

Moreover, as shown in FIG. 7, as a result of providing the resistor 7 in parallel to the diode 6 which prevents a current from flowing in the reverse direction, it is also possible to flow a slight amount of discharge current to the other modules via the resistor 7 even during a discharge. Thus, even in cases where the battery voltage measurement circuit 2 is configured from a single IC, the drive of the overall battery system will not be interrupted.

2. Second Embodiment

Charge

Figure 8:
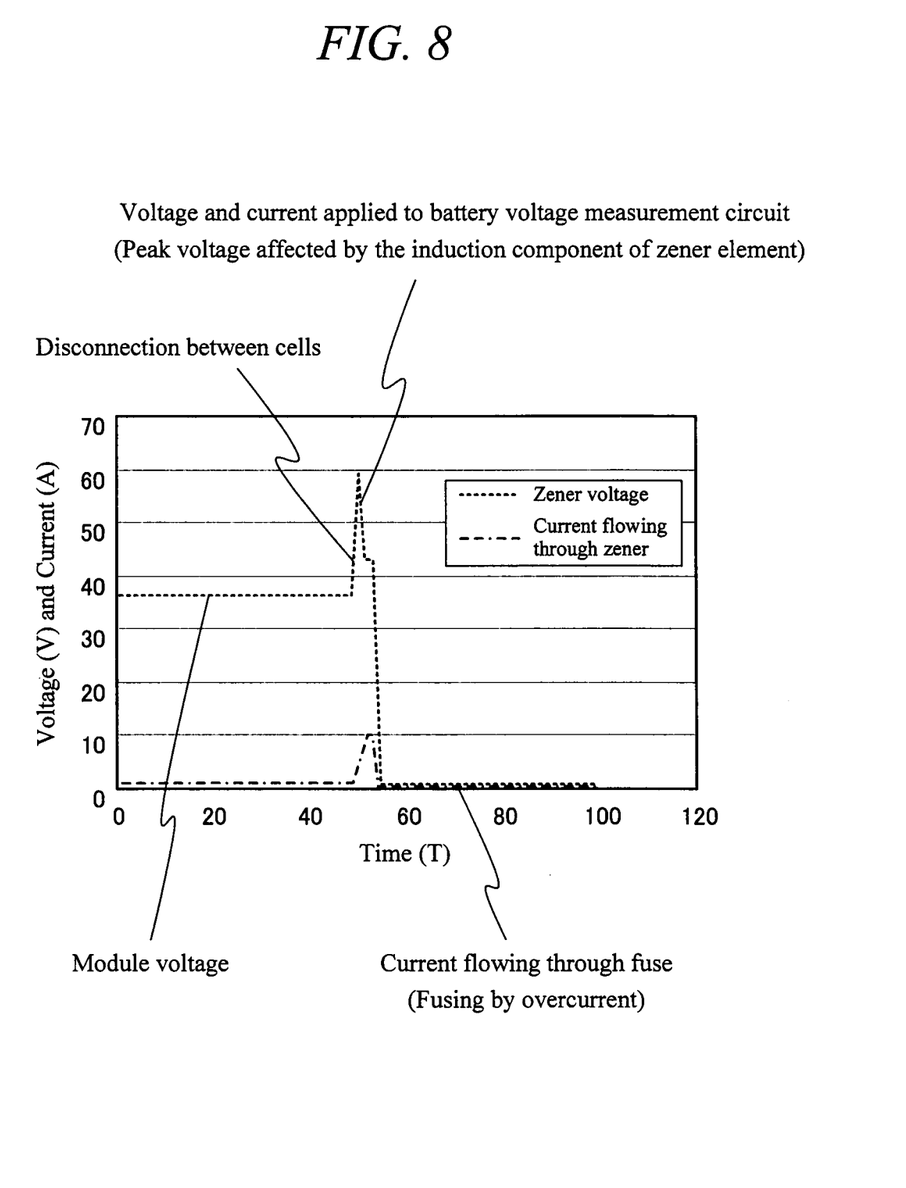
FIG. 8 is a diagram according to the second embodiment of the present invention showing the passage of the voltage and current values of the measurement circuit when inter-cell disconnection occurs during a charge.

The battery system according to a second embodiments is now explained with reference to FIG. 7 and FIG. 8. FIG. 7 is a configuration block diagram according to the second embodiment, and FIG. 8 is a graph showing the passage of the voltage and current values applied to the battery voltage measurement circuit in the battery system configured as shown in FIG. 7 when the connection between the cells in the module is disconnected. Note that the number of batteries, the number of modules and the cell voltage shown below are arbitrary, and are not limited to the modes shown in FIG. 7 and FIG. 8. The same reference numeral is given to the same configuration used in the foregoing first embodiment.

Figure 11:
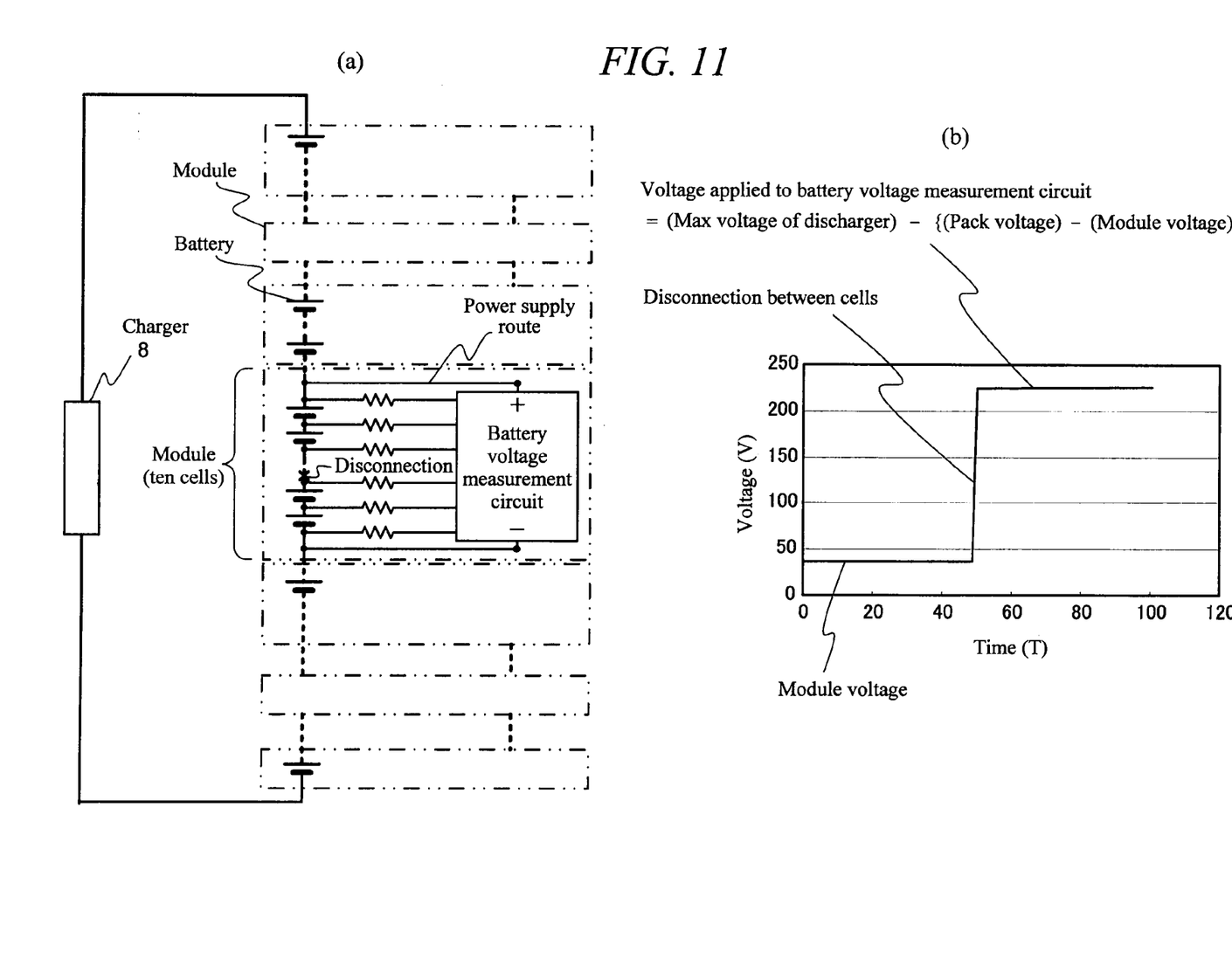
FIG. 11(a) is a configuration block diagram showing an example of a battery system according to conventional technology.
FIG. 11(b) is a diagram showing the passage of the voltage and current vales of the measurement circuit according to conventional technology when inter-cell disconnection occurs during a charge.

As shown with the conventional technology of FIG. 11, with the configuration block diagram of FIG. 7, modules are disposed, which are configured from 10 cells respectively having batteries 1 and being connected in series, and 10 of these modules are connected in series, and further connected to a charger 8. Here, as with the first embodiment, an example of a battery pack using a lithium battery in which the voltage of each cell is 3.6 V, is explained.

As with the first embodiment, the modules are internally provided with a battery voltage measurement circuit 2 for measuring the voltage of each cell in the modules, and the batteries 1 of each cell are connected to the battery voltage measurement circuit 2 through a cell voltage detection line. With regard to the battery voltage measurement circuit 2, an overvoltage protective zener diode 9 is disposed in the power supply route of the battery voltage measurement circuit 2. The overvoltage protective zener diode 9 is adapted such that the anode thereof is connected to a cell of the low voltage potential side in the module and the cathode thereof is connected to a cell of the high voltage potential side in the module. This overvoltage protective zener diode 9 is also adapted such that the anode thereof is connected to the negative electrode of a drive power source of the voltage measurement circuit and the cathode thereof is connected to the positive electrode of the drive power source of the voltage measurement circuit.

As shown in FIG. 8, during a disconnection, since a peak voltage will arise due to the wiring up to the zener diode 9 as the power supply route of the battery voltage measurement circuit 2 and the induction component of the zener diode 9, used is a zener diode 9 in which such peak voltage will not exceed the withstand voltage of the discrete component configuring the battery voltage measurement circuit 2. In addition, as the zener diode 9, adopted is a type that will generate a zener voltage that is greater than the normally maximum voltage potential in the module.

Moreover, as with the first embodiment, a fuse 4 as an overcurrent protective element is also provided to the power supply route of the battery voltage measurement circuit 2. As the fusing characteristics of the fuse 4, the rated current value is set to be smaller than the tolerated current value of the zener diode 9 and the tolerated current value of the printed pattern having a circuit mounted thereon, and to a value where fusing will not occur with the consumption current of the battery voltage measurement circuit 2. Specifically, a fuse 4 that satisfies the foregoing conditions of a rated current value is selected.

In addition, a resistor 5 for preventing a short circuit of the voltage detection line is respectively disposed on the voltage detection line connecting the batteries 1 of each cell in the module and the battery voltage measurement circuit 2, and an input protective diode not shown is provided inside the IC of the battery voltage measurement circuit 2.

With a battery system configured as described above, if the connection between the cells in the module is disconnected during a discharge, as shown in FIG. 8, only a zener voltage is applied by the overvoltage protective zener diode 9 connected to the battery voltage measurement circuit 2, and a voltage exceeding the withstand voltage of the measurement circuit 2 will not be applied to the measurement circuit 2.

In addition, as shown in FIG. 7, since the fuse 4 will be instantaneously subjected to fusing as the overcurrent protection unit due to the overcurrent (charge current) flowing in the power supply route of the battery voltage measurement circuit 2, no voltage will be applied to the battery voltage measurement circuit 2 (voltage value: 0 V), and it is further possible to prevent the overcurrent from flowing in the battery voltage measurement circuit 2 or in the pattern of the printed circuit board having a circuit mounted thereon (current value: 0 A). Consequently, it is possible to inhibit the circuit components, printed pattern and the like from generating heat, generating smoke, and igniting.

3. Third Embodiment

Charge/Discharge

Figure 9:
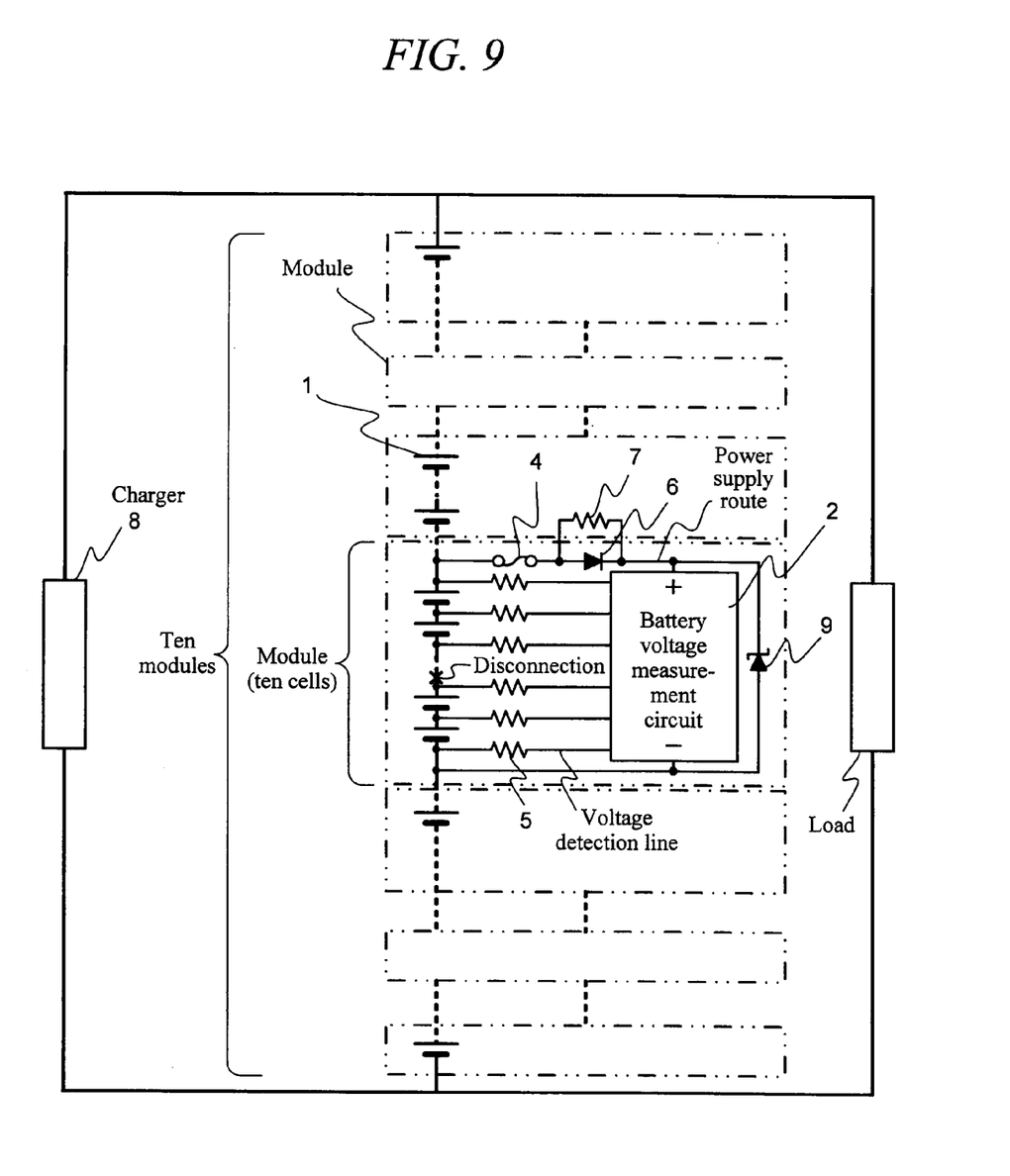
FIG. 9 is a configuration block diagram showing the battery system according to the third embodiment of the present invention.

The battery system according to a third embodiment is now explained with reference to FIG. 9. FIG. 9 is a configuration block diagram according to the third embodiment, the same reference numeral is given to the same configuration used in the foregoing first embodiment and second embodiment. In addition, the number of batteries, the number of modules and the cell voltage shown below are arbitrary, and are not limited to the modes shown in FIG. 9.

With the configuration block diagram of FIG. 9, as with the first embodiment and second embodiment, modules are disposed, which are configured from 10 cells respectively having batteries 1 and being connected in series, and 10 of these modules are connected in series, and further connected to a charger 8. Here, as with the first embodiment and second embodiment, an example of a battery pack using a lithium battery in which the voltage of each cell is 3.6 V, is explained.

The modules are internally provided with a battery voltage measurement circuit 2 for measuring the voltage of each cell in the modules, and the batteries 1 of each cell are connected to the battery voltage measurement circuit 2 through a cell voltage detection line. With regard to the battery voltage measurement circuit 2, an overvoltage protective zener diode 9 is disposed in the power supply route of the battery voltage measurement circuit 2. The overvoltage protective zener diode 9 is adapted such that the anode thereof is connected to a cell of the low voltage potential side in the module and the cathode thereof is connected to a cell of the high voltage potential side in the module. This overvoltage protective zener diode 9 is also adapted such that the anode thereof is connected to the negative electrode of a drive power source of the voltage measurement circuit and the cathode thereof is connected to the positive electrode of the drive power source of the voltage measurement circuit.

During a disconnection, since a peak voltage will arise due to the wiring up to the zener diode 9 as the power supply route of the battery voltage measurement circuit 2 and the induction component of the zener diode 9, used is a zener diode 9 in which such peak voltage will not exceed the withstand voltage of the discrete component configuring the battery voltage measurement circuit 2. In addition, as the zener diode 9, adopted is a type that will generate a zener voltage that is greater than the normally maximum voltage potential in the module.

Moreover, a fuse 4 as an overcurrent protective element, an overcurrent blocking diode 6, and a resistor 7 connected in parallel to the diode 6 are provided to the power supply route of the battery voltage measurement circuit 2. In FIG. 9, although the fuse 4 is disposed on the battery 1 side relative to the circuit configured from the diode 6 and the resistor 7 that is connected in parallel to the diode 6, there is no particular limitation to this arrangement, and the present embodiment also covers the mode of providing the fuse 4 to the side of the battery voltage measurement circuit 2.

As the fusing characteristics of the fuse 4, the rated current value is set to be smaller than the tolerated current value of the zener diode 9 and the tolerated current value of the printed pattern having a circuit mounted thereon, and to a value where fusing will not occur with the consumption current of the battery voltage measurement circuit 2. Specifically, a fuse 4 that satisfies the foregoing conditions of a rated current value is selected.

Moreover, the diode 6 is disposed such that the forward direction of the diode 6 is the direction of supplying power to the battery voltage measurement circuit 2. Specifically, the diode 6 is disposed such that its forward direction is the direction of blocking an overcurrent during a discharge. As the resistor 7 that is connected in parallel to the diode 6, selected is a type that is able to realize a voltage drop that is smaller than the voltage in the forward direction of the diode 6 when a current that is required for the operation of the battery voltage measurement circuit 2 is flowing.

In addition, a resistor 5 for preventing a short circuit of the voltage detection line is respectively disposed on the voltage detection line connecting the batteries 1 of each cell in the module and the battery voltage measurement circuit 2, and an input protective diode not shown is provided inside the IC of the battery voltage measurement circuit 2.

With the battery system configured as described above, if the connection between the cells in the module is disconnected during a discharge, the surge voltage is absorbed by the overvoltage protective zener diode 9 connected to the battery voltage measurement circuit 2, and only a voltage in the forward direction of the zener diode 9 will be applied, and a voltage exceeding the withstand voltage of the measurement circuit 2 will not be applied to the battery voltage measurement circuit 2.

Moreover, as a result of providing the diode 6 that prevents the current from flowing in the reverse direction for blocking an overcurrent and providing the resistor 7 in parallel to the diode 6, it is possible to flow a slight amount of discharge current to the other modules via the resistor 7 even during a discharge. Thus, even in cases where the battery voltage measurement circuit 2 is configured from a single IC, the drive of the overall battery system will not be interrupted.

Moreover, by the resistor 5 disposed on the voltage detection line connecting the respective cell voltage input circuits (not shown) of the IC inside the battery voltage measurement circuit 2 with the batteries 1, and by the input protective diode (not shown) inside the IC of the battery voltage measurement circuit 2, the input to the IC will not exceed the power supply voltage of the IC. Thus, it is possible to prevent a latch-up. Consequently, since it is possible to inhibit the circuit components, printed pattern and the like from generating heat, generating smoke and igniting, it is possible to reuse the battery voltage measurement circuit 2, which has not been destroyed, by repairing the disconnection between the cells.

Meanwhile, even if the connection between the cells in the module is disconnected during a charge, due to the overvoltage protective zener diode 9 connected to the battery voltage measurement circuit 2, only a zener voltage will be applied, and a voltage exceeding the withstand voltage of the measurement circuit 2 will not be applied to the measurement circuit 2. In addition, since the fuse 4 will be instantaneously subjected to fusing as the overcurrent protection terminal due to the overcurrent (charge current) arising when a disconnection occurs, no voltage will be applied to the battery voltage measurement circuit 2, and it is possible to prevent the overcurrent from flowing in the battery voltage measurement circuit 2 or in the pattern of the printed circuit board having a circuit mounted thereon. Consequently, it is possible to inhibit the circuit components, printed pattern and the like from generating heat, generating smoke, and igniting.

Other Embodiments

The present invention is not limited to the embodiments using a fuse as the overcurrent protective element as described above, and also covers embodiments using a self-recovering type overcurrent protective element such as a PolySwitch using conductive polymer in substitute for the fuse. Consequently, when using a fuse, while the fuse cannot be used once it is subjected to fusing until it is replaced, by using the PolySwitch as the self-recovering type overcurrent protective element, such PolySwitch can be repeatedly used without having to be replaced.

Moreover, the present invention is not limited to the embodiments using an overvoltage protective zener diode as described above, and also covers embodiments using a metal oxide varistor in substitute for the zener diode. As a result of using this metal oxide varistor, it is possible to protect the battery voltage measurement circuit 2 from a sudden high voltage that occurs due to the disconnection between the cells in the module. The metal oxide varistor functions similar to the zener diode as a result of its terminations being respectively connected to the positive electrode and the negative electrode of the drive power source of the battery voltage measurement circuit.

In addition, the present invention is not limited to the embodiments of preventing the load of a voltage exceeding the withstand voltage of the measurement circuit when the connection of the cells in the module is disconnected as described above, and also covers embodiments of cases where the current line between the modules is disconnected. Specifically, even in cases where the current line between the modules is disconnected, and not the cells in the module, as per the foregoing first to third embodiments, the voltage that is applied to the battery voltage measurement circuit can be made to be lower than the withstand voltage of the measurement circuit by means of the reverse voltage protective diode or the overvoltage protective zener diode.

The invention claimed is:

1. A battery system in which one or more modules are connected in series, wherein each of the modules comprises:
   a plurality of batteries connected in series;
   a voltage measurement circuit for measuring a voltage of each of the batteries;
   an overcurrent protection unit connected to the voltage measurement circuit;
   a reverse voltage protective diode in which the cathode thereof is connected to the positive electrode of a drive power source of the voltage measurement circuit and the anode thereof is connected to the negative electrode of the drive power source of the voltage measurement circuit; and
   a resistor for preventing a short circuit, which is disposed on a voltage detection line between each of the batteries and the voltage measurement circuit.

2. A battery system in which one or more modules are connected in series, wherein each of the modules comprises:
   a plurality of batteries connected in series;
   a voltage measurement circuit for measuring a voltage of each of the batteries;
   an overcurrent protection unit connected to the voltage measurement circuit;
   an overvoltage protective zener diode in which the cathode thereof is connected to the positive electrode of a drive power source of the voltage measurement circuit and the anode thereof is connected to the negative electrode of the drive power source of the voltage measurement circuit; and
   a resistor for preventing a short circuit, which is disposed on a voltage detection line between each of the batteries and the voltage measurement circuit.

3. A battery system in which one or more modules are connected in series, wherein each of the modules comprises:
   a plurality of batteries connected in series;
   a voltage measurement circuit for measuring a voltage of each of the batteries;
   an overcurrent protection unit connected to the voltage measurement circuit;
   a metal oxide varistor in which the terminations thereof are respectively connected to the positive electrode and the negative electrode of a drive power source of the voltage measurement circuit; and
   a resistor for preventing a short circuit, which is disposed on a voltage detection line between each of the batteries and the voltage measurement circuit.

4. The battery system according to any one of claims 1 to 3, wherein:
   the overcurrent protection unit is configured from a fuse.

5. The battery system according to any one of claims 1 to 3, wherein:
   the overcurrent protection unit is configured from a self-recovering type overcurrent protective element.

6. The battery system according to any one of claims 1 to 3, wherein:
   the overcurrent protection unit is configured from a diode, and
   the forward direction of the diode is a direction in which an overcurrent is blocked.

7. The battery system according to claim 6, wherein each of the modules further comprises:
   a resistor connected in parallel to the diode.

8. A battery system in which one or more modules are connected in series, wherein each of the modules comprises:
   a plurality of batteries connected in series;
   a voltage measurement circuit for measuring a voltage of each of the batteries;
   an overcurrent protective element connected to the voltage measurement circuit;
   a diode connected in series to the overcurrent protective element, the forward direction thereof being a direction in which an overcurrent is blocked;
   a resistor connected in parallel to the diode;
   an overvoltage protective zener diode in which the cathode thereof is connected to the positive electrode of a drive power source of the voltage measurement circuit and the anode thereof is connected to the negative electrode of the drive power source of the voltage measurement circuit; and
   a resistor for preventing a short circuit, which is disposed on a voltage detection line between each of the batteries and the voltage measurement circuit.

9. A battery system in which one or more modules are connected in series, wherein each of the modules comprises:
   a plurality of batteries connected in series;
   a voltage measurement circuit for measuring a voltage of each of the batteries;
   an overcurrent protective element connected to the voltage measurement circuit;
   a diode connected in series to the overcurrent protective element, the forward direction thereof being a direction in which an overcurrent is blocked;
   a resistor connected in parallel to the diode;
   a metal oxide varistor in which the terminations thereof are respectively connected to the positive electrode and the negative electrode of a drive power source of the voltage measurement circuit; and
   a resistor for preventing a short circuit, which is disposed on a voltage detection line between each of the batteries and the voltage measurement circuit.

10. The battery system according to claim 8 or 9, wherein:
    the overcurrent protective element is configured from a fuse.

11. The battery system according to claim 8 or 9, wherein:
    the overcurrent protective element is of a self-recovering type.

* * * * *